United States Patent
Ghioni et al.

(10) Patent No.: US 11,201,103 B2
(45) Date of Patent: Dec. 14, 2021

(54) VAPOR CHAMBER ON HEAT-GENERATING COMPONENT

(71) Applicant: Microsoft Technology Licensing, LLC, Redmond, WA (US)

(72) Inventors: Lincoln Matthew Ghioni, Redmond, WA (US); Brian J. Toleno, Cupertino, CA (US); Sahar Vilan, Atlit (IL); Han Li, Sammamish, WA (US); Bo Dan, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/428,820

(22) Filed: May 31, 2019

(65) Prior Publication Data

US 2020/0381337 A1  Dec. 3, 2020

(51) Int. Cl.
*H01L 23/427* (2006.01)
*H01L 21/48* (2006.01)
*F28D 15/02* (2006.01)

(52) U.S. Cl.
CPC ............ *H01L 23/427* (2013.01); *F28D 15/02* (2013.01); *H01L 21/4882* (2013.01)

(58) Field of Classification Search
CPC ....... H01L 21/4882; H01L 23/36–4735; H01L 31/024; H01L 31/052–0525; H01L 33/64–648; H01L 45/1286; H01L 51/529; H01L 2933/0075; H01L 2023/4018–4087; H01L 23/427; H01L 21/4803; F28D 15/02
See application file for complete search history.

(56) References Cited

U.S. PATENT DOCUMENTS

| | | | |
|---|---|---|---|
| 4,012,770 A | 3/1977 | Pravda et al. | |
| 4,697,205 A | 9/1987 | Eastman | |
| 5,179,500 A | 1/1993 | Koubek et al. | |
| 5,470,651 A | 11/1995 | Milinkovic et al. | |
| 6,082,443 A * | 7/2000 | Yamamoto | F28D 15/0233 165/104.21 |
| 6,639,799 B2 | 10/2003 | Prasher et al. | |
| 7,077,189 B1 * | 7/2006 | Reyzin | F28D 15/00 165/104.21 |
| 8,176,972 B2 | 5/2012 | Mok | |

(Continued)

FOREIGN PATENT DOCUMENTS

| | | |
|---|---|---|
| CN | 102259825 A | 11/2011 |
| EP | 0002996 A1 | 7/1979 |
| JP | S61265850 A | 11/1986 |

OTHER PUBLICATIONS

"International Search Report and Written Opinion Issued in PCT Application No. PCT/US2020/028890", dated Aug. 11, 2020, 13 Pages.

(Continued)

*Primary Examiner* — Cuong B Nguyen
(74) *Attorney, Agent, or Firm* — Alleman Hall Creasman & Tuttle LLP

(57) ABSTRACT

A vapor chamber device is provided. The vapor chamber device includes a heat-generating component, a first metallic layer deposited directly on the heat-generating component, and a second metallic layer deposited so as to contact the first metallic layer at a perimeter. The first and second metallic layers fully enclose an internal void formed therein.

13 Claims, 7 Drawing Sheets

(56) References Cited

U.S. PATENT DOCUMENTS

| | | |
|---|---|---|
| 10,224,264 B1 * | 3/2019 | Merrikh .............. H01L 23/3736 |
| 2004/0190251 A1 | 9/2004 | Prasher et al. |
| 2006/0141675 A1 | 6/2006 | Hwang et al. |
| 2011/0083835 A1 * | 4/2011 | Chen ..................... H01L 23/427 |
| | | 165/185 |
| 2017/0156240 A1 | 6/2017 | Silvennoinen et al. |
| 2018/0143673 A1 | 5/2018 | Jenkins et al. |
| 2018/0164042 A1 | 6/2018 | Stellman et al. |
| 2019/0035713 A1 * | 1/2019 | Prajapati ............ H05K 7/20309 |

OTHER PUBLICATIONS

Ji, et al., "Copper Foam Based Vapor Chamber for High Heat Flux Dissipation", In Journal of Experimental Thermal and Fluid Science, vol. 40, Jul. 2012, pp. 93-102.

* cited by examiner

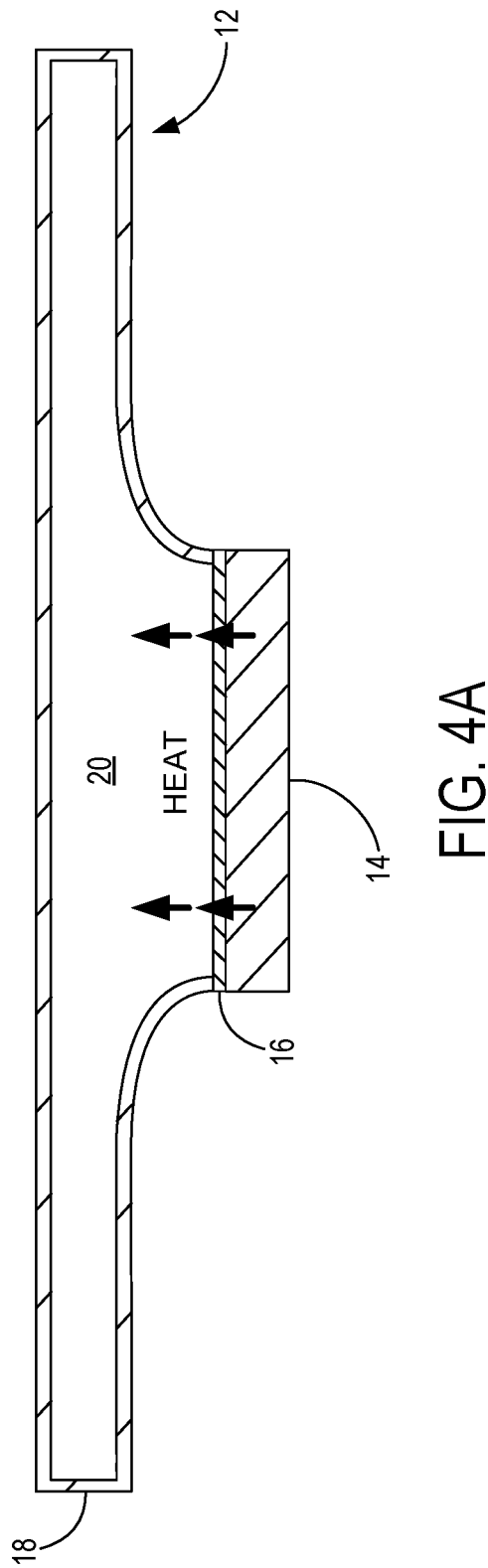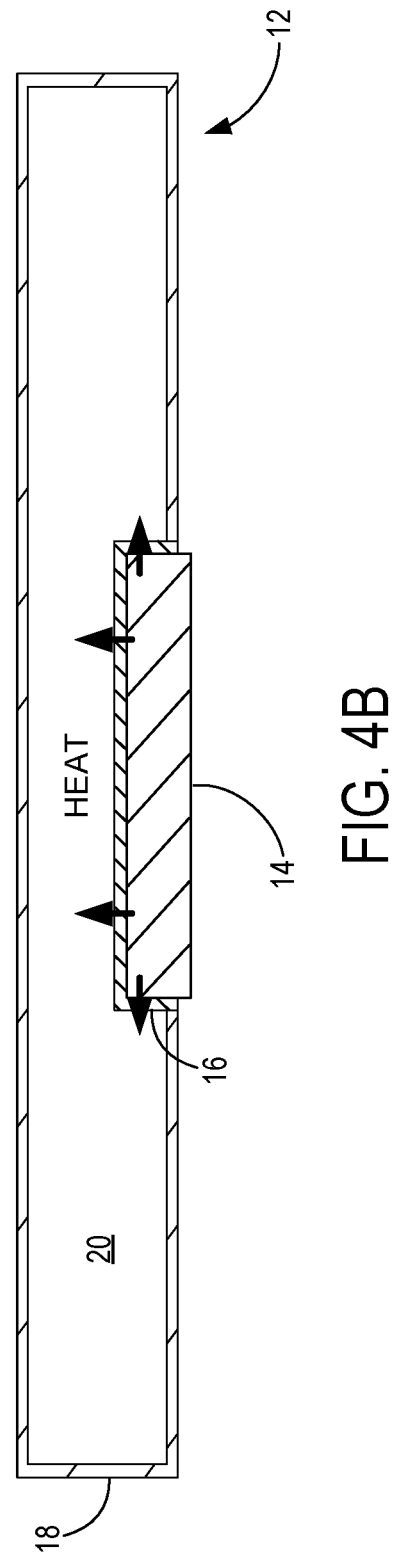

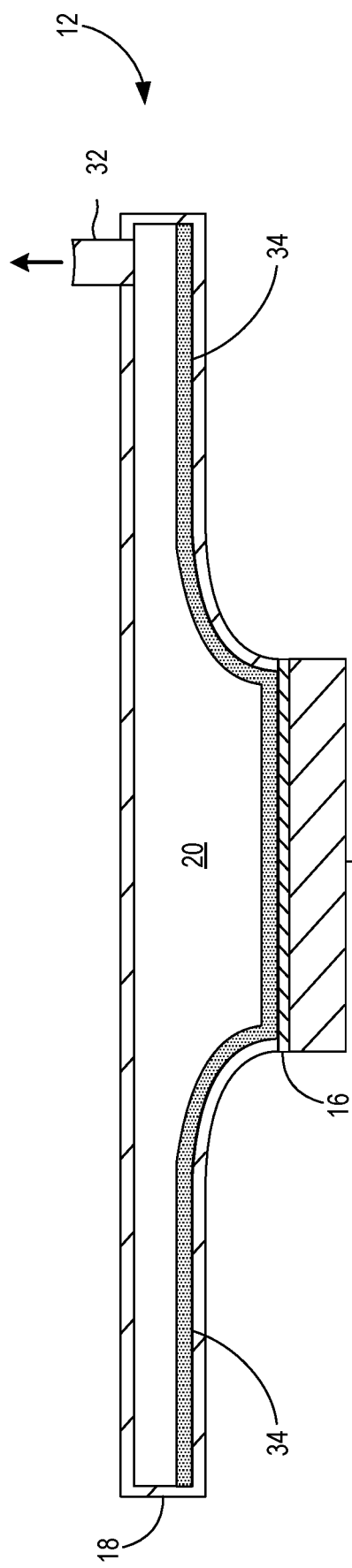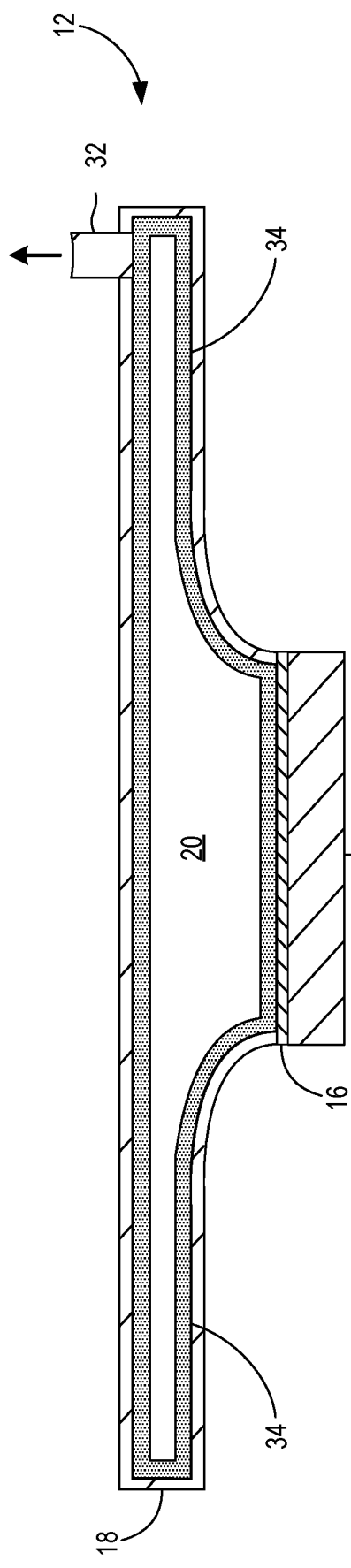

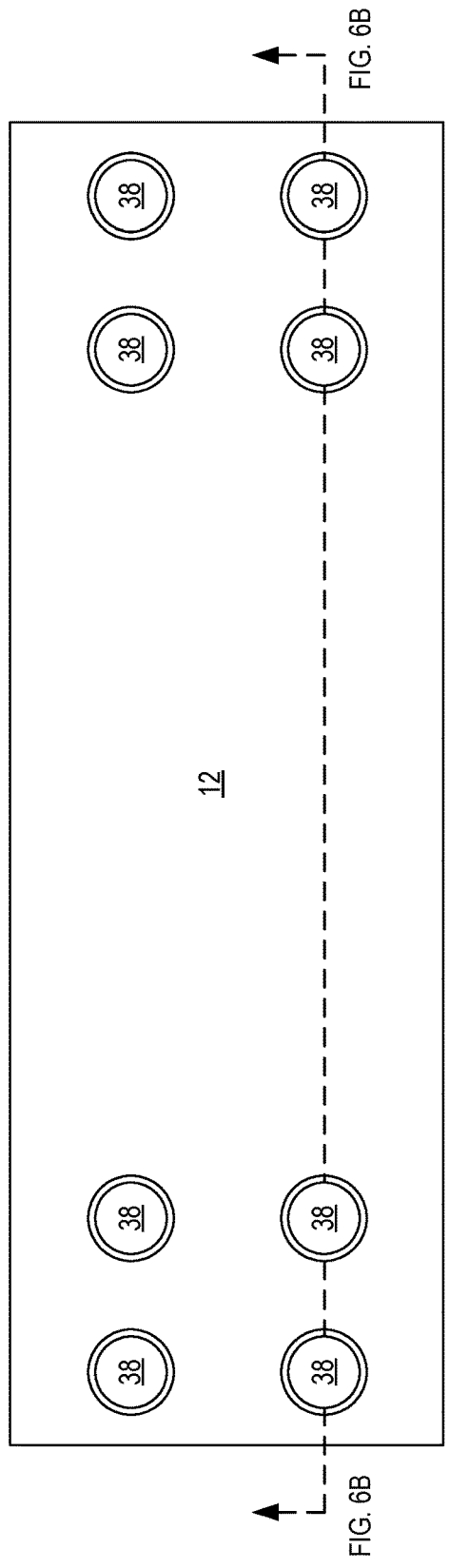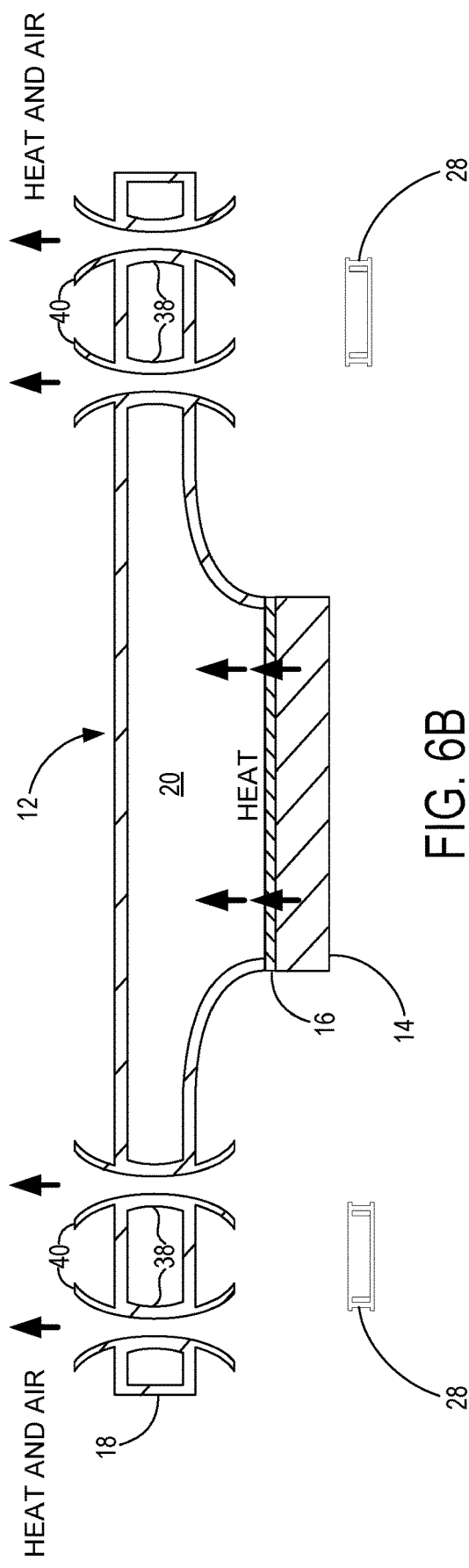

VAPOR CHAMBER ON HEAT-GENERATING COMPONENT

BACKGROUND

Heat-generating components in electronic devices generally incorporate thermal modules for optimal performance. Vapor chambers, heat pipes, and heat sinks included in thermal modules draw heat away from the heat-generating electronic components to improve performance and avoid electronic malfunctioning. In the case of vapor chambers, heat is stored in a working fluid during evaporation, carried by the working fluid, and then dissipated during condensation. In this manner, an electronic device may be cooled. As electronic devices evolve and technologies for their components adapt, thermal modules are similarly developed to optimally distribute heat for the given device. Manufacturing thermal modules for not only adequate heat distribution but to maximize performance of a device is a matter of continuing development.

SUMMARY

A vapor chamber device is provided. The vapor chamber device may include a heat-generating component, a first metallic layer deposited directly on the heat-generating component, and a second metallic layer deposited so as to contact the first metallic layer at a perimeter. The first and second metallic layers may fully enclose an internal void of a vapor chamber formed therein.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 4A and 4B are cross-sectional views illustrating the vapor chamber device according to example implementations of the present disclosure.

FIGS. 5A and 5B show the vapor chamber device according to example embodiments that include a mesh.

FIGS. 6A and 6B show the vapor chamber device according to an example embodiment, where FIG. 6A is a top view and FIG. 6B is a cross-sectional view of FIG. 6A.

DETAILED DESCRIPTION

Disclosed herein is a vapor chamber device that may be built by directly depositing one wall or side of a vapor chamber on a heat-generating component. The heat-generating component may be a part within an electronic device. In conventional vapor chamber manufacturing, a vapor chamber that is in thermal contact with a heat-generating component may contact a thermal interface material (TIM) that is positioned between the vapor chamber and the heat-generating component. The thermal interface material may be a sheet or paste that interfaces with, for example, a silicon chip as a heat-generating component. A vapor chamber may be held onto the silicon chip over the layer of thermal interface material by a spring force applied by fastening the components under pressure within the electronic device. Thermal resistance between the heat-generating component, the TIM, and the vapor chamber is preferably minimized. Factors including bond line thickness of the thermal interface material, surface wetting capability and contact resistance, and thermal conductivity may impact heat transfer through the interface. While a better thermal conductor than air, the TIM may generally be a relatively poor thermal conductor compared to the vapor chamber itself and heat-conducting materials in general. Thus, to reduce thermal resistance at the interface of the heat-generating component and vapor chamber, designers generally work to minimize the thickness of TIM, reduce unevenness, and avoid creating air bubbles and other obstructions. The vapor chamber device disclosed herein may include one wall or side directly deposited on the heat-generating component. Therefore, one potential advantage may be improved thermal conductivity between layers of the thermal module since a need for thermal interface material and its complicating factors may be eliminated.

In the conventional case of adhering the vapor chamber to the heat-generating component, the vapor chamber may be constructed in a separate manufacturing process from other components and later positioned at the heat-generating component. However, the vapor chamber device described herein may be manufactured in a same process as the heat-generating component to which it will be attached. When the heat-generating component being manufactured is a silicon chip, a single manufacturing process may be employed to both, for example, sputter copper for interconnections on one side of the chip and sputter copper on an opposite side of the chip to form a first wall or side of the vapor chamber. Thus, an improvement in the manufacturing process may be possible with the vapor chamber device as described herein. This and other potential advantages will be further discussed.

Figure 1:
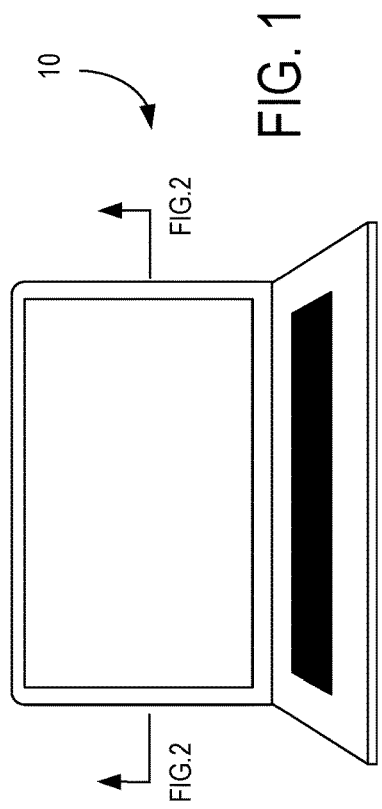
FIG. 1 is a front view showing an electronic device housing at least one heat-generating component onto which a vapor chamber is formed.
Figure 2:
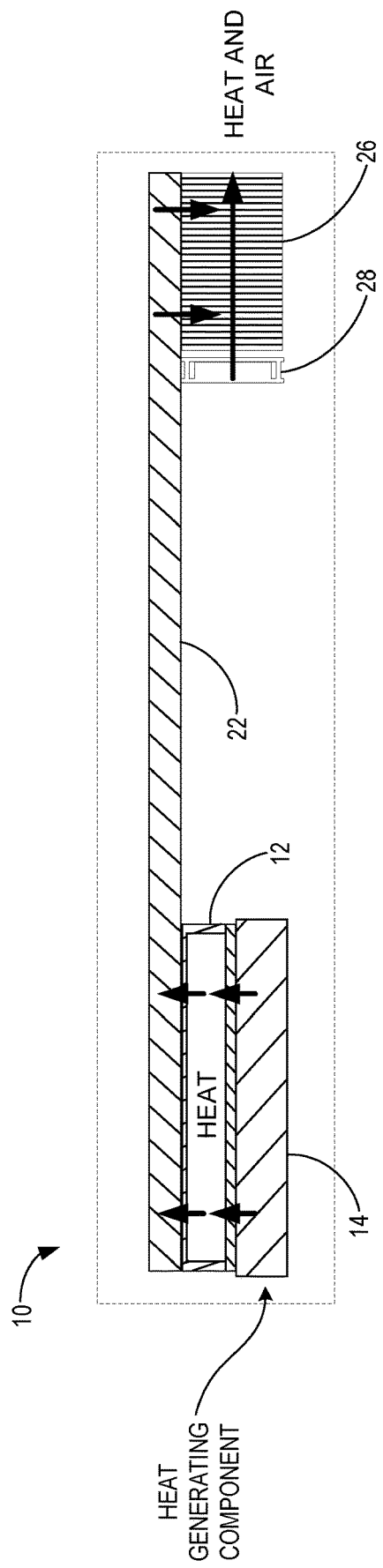
FIG. 2 is a section view showing a cross-section of the electronic device of FIG. 1 with a heat-generating component and the vapor chamber device detailed.

As disclosed herein, the vapor chamber device may include the heat-generating component as interfaced with a vapor chamber 12 and additional components for heat dissipation constitutive of the vapor chamber device as a unit. FIG. 1 is a front view showing an electronic device 10 housing at least one heat-generating component onto which a vapor chamber 12 may be formed. The electronic device 10 may be a laptop computer as shown in FIG. 1 or may alternatively be a tablet computer, smart phone, head-mounted device, wearable computing device, medical device, laser device, automotive electronics, or any other device requiring the dissipation of a heat load. FIG. 2 is a section view showing a cross-section of the electronic device 10 of FIG. 1. As shown in FIG. 2, the vapor chamber 12 may include the heat-generating component as the vapor chamber 12 may be formed directly onto the surface of the heat generating component without the use of a thermal interface material or other intervening material. The heat generating component in FIG. 2 is a processor 14, although the heat-generating component may also be a GPU, integrated circuit, display, laser, or other heat-generating component. In an alternative configuration, the vapor chamber 12 may be formed directly on a covering of a heat generating component.

As shown in FIG. 2, an additional thermal module 22 may interface with the vapor chamber 12, which in this example implementation is a heat pipe to draw heat away from the processor 14. The vapor chamber 12 may be a first vapor chamber and the additional thermal module 22 may include one or more components selected from the group consisting of a heat sink, a heat spreader, a heat pipe, and a second vapor chamber, among other application-appropriate types of thermal modules. The interface between the additional module 22 and the vapor chamber 12 is further described below. It will be appreciated that the vapor chamber 12 and additional thermal module 22 may contain different working fluids. A heat sink 26 in thermal connection with the heat pipe may further draw heat away from the heat-generating components; additionally, a fan 28 may be employed to generate forced convection, moving heat to an exterior of the electronic device 10.

Figure 3:
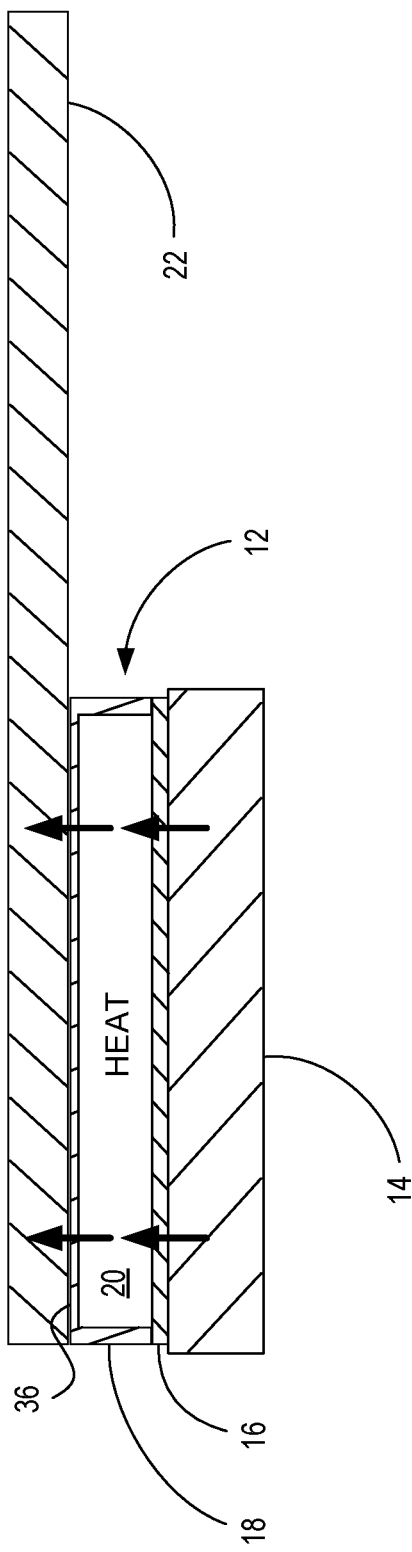
FIG. 3 is a cross-sectional view illustrating the vapor chamber device according to one implementation of the present disclosure.

With respect to FIGS. 3 and 4, which show cross-sectional views of the vapor chamber device according to two example implementations, respectively, the vapor chamber device may include a first metallic layer 16 deposited directly on the heat-generating component and a second metallic layer 18 deposited so as to contact the first metallic layer 16 at a perimeter. The first and second metallic layers 16, 18 may fully enclose an internal void 20 of a vapor chamber 12 formed therein. As mentioned above for FIG. 2, an additional thermal module 22 may interface with the vapor chamber 12, which is also shown in FIG. 3. In FIG. 4A, a vapor chamber 12 is shown with a volume much greater than the vapor chamber 12 in FIG. 3. In this case, assembly of an additional thermal module may be omitted. FIG. 4B shows a similar configuration as FIG. 4A, except that in this example configuration the first metallic layer 16 is formed partially around the sides of the heat generating component. As such, if there is no mechanical interference with other components and the extension of the sides of the vapor chamber 12 from the heat-generating component may be accommodated, the combination of the heat-generating component and the vapor chamber 12 may fill less space in the vertical direction compared to the configuration of FIG. 4A.

It will be appreciated that although a thermal interface material may not be used below the first metallic layer 16 and over the heat generating component, a thermal interface material 36 as shown in FIG. 3 may be applied to an external surface of the second metallic layer 18 that forms a wall of the vapor chamber 12, and the additional thermal module 22 may interface with the thermal interface material 36. As the interface between the vapor chamber 12 and the additional thermal module 22 may be a metal-metal interface, a metal solder may be applied between the two components that has a significantly higher thermal conductivity than a polymer type thermal interface material of the kind that may be applied between the surface of the processor 14 and the vapor chamber 12. Rather than a soldering method, brazing may be employed or a conventional polymer thermal interface material may be applied. Alternatively, the additional thermal module 22 may be put in thermal contact with the vapor chamber 12 via another appropriate process.

Turning now to dimensions, the first metallic layer 16, the internal void 20, and the second metallic layer 18 may have a combined thickness of at least 0.30 mm. However, the thickness may also be at least 0.40 mm, at least 0.60 mm, or thicker, particularly in cases where performance is not restricted by dimensional constraints. Regarding surface area, a surface area of the first metallic layer 16 may be substantially equal to a surface area of the heat-generating component at a surface on which the first metallic layer 16 is deposited. FIGS. 3 and 4 depict the surface area of the processor 14 on which the first metallic layer 16 is applied and the surface area of the first metallic layer 16 as substantially equal. This configuration may be preferential for effective heat transfer from the heat generating component. However, it will be appreciated that the first metallic layer 16 may be formed on any size subarea of the surface area of the heat generating component. It will be further appreciated that the vapor chamber 12 may include a surface area within a fairly wide range, for example from only a few millimeters to 100 mm×100 mm in area or larger.

A potential advantage of forming the first metallic layer 16 directly on the heat generating component is that the vapor chamber 12 may be precisely formed in place on the heat generating component. In contrast with using a thermal interface material 36 between the processor 14 and the vapor chamber 12 and a compression force, greater control of the adhering process of the first metallic layer 16 may be possible. The first metallic layer 16 may be applied to the heat generating component without air pockets or other disturbances to the evenness of the interface between the heat generating component and the vapor chamber 12. Voids and unevenness in the interface may result in locally higher thickness of thermal interface material and thus higher thermal resistance in the respective area. Also, heat distribution may be more even in the configuration where the heat generating component directly interfaces with the vapor chamber 12. This may be particularly advantageous as heat may be generated from point sources on a processor 14 that, when not properly spread, may damage the processor 14.

As in the configuration of the processor 14 in FIG. 2, the heat-generating component may be a silicon chip onto which electronic components have been formed by sputtering. For example, copper interconnects for transistors may be sputtered on the silicon chip. The first metallic layer 16 may be deposited by sputtering on a surface of the silicon chip opposite from a surface onto which the electronic components have been formed, the forming of the electronic components and the depositing of the first metallic layer 16 executed in a single manufacturing process. Streamlining the process of creating the processor 14 and the vapor chamber device is one potential advantage of this configuration.

It will be appreciated that one or more manufacturing processes may be executed to build the vapor chamber 12 on the heat generating component. For example, the first and second metallic layers 16, 18 may be deposited by one or more processes selected from the group consisting of sputtering, electroplating, electroforming, and electroless plating. The first and/or second metallic layers 16, 18 may be formed by first sputtering as a foundation for the first and/or second metallic layers 16, 18, over which more copper or another metal may be further electroplated or electroformed. The first metallic layer 16 may also include a surface pattern formed by etching or another process to create a textured surface that may foster capillary action of a working fluid. Other manufacturing processes appropriate to applying the first metallic layer 16 and second metallic layer 18 directly on a heat generating component may be effected as appropriate to the technological application.

The first metallic layer 16 and the second metallic layer 18 may include one or more materials selected from the group consisting of copper and gold. Although copper may be a preferred metal for forming the first and second metallic layers 16, 18, gold may be used for certain applications or a combination of gold and copper may be utilized. Other metals such as aluminum may also be appropriate depending on the construction of the heat generating component.

Figure 7:
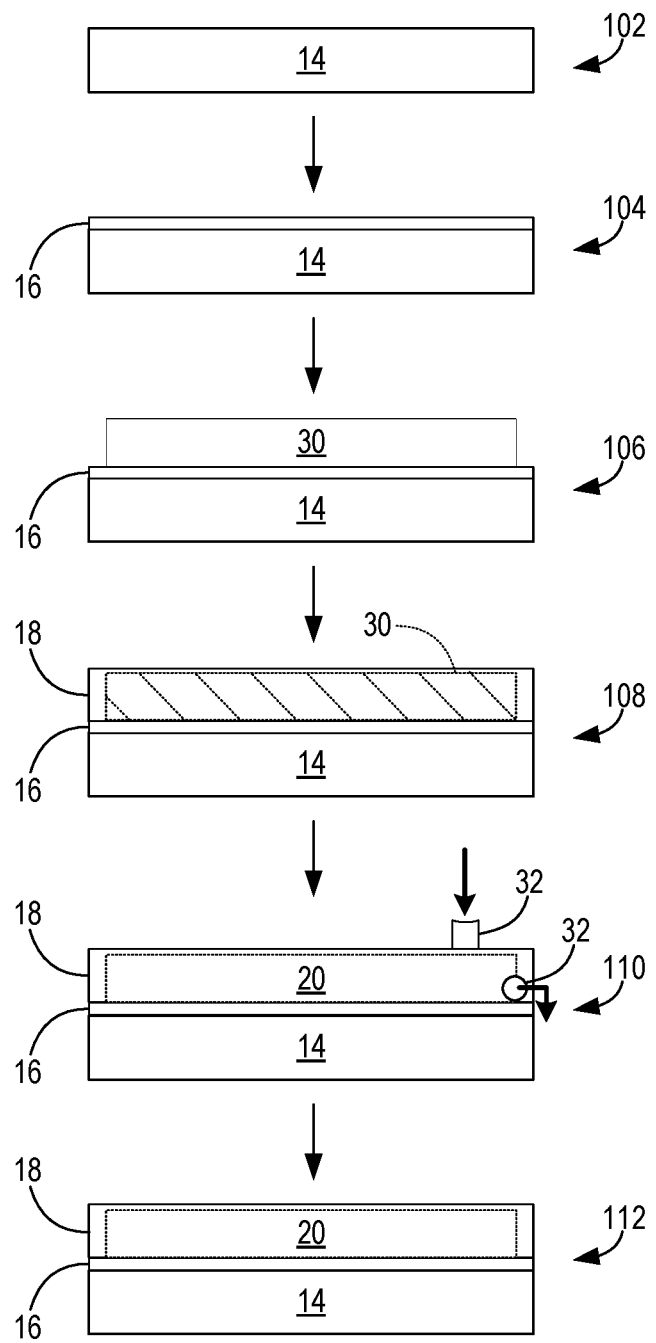
FIG. 7 shows progressive steps in the manufacture of the vapor chamber device according to one example implementation of the present disclosure.

A metallic core material 30, as included at the relevant process steps of FIG. 7, may be adhered to the first metallic layer 16 to form a surface onto which the second metallic layer 18 may be deposited. The shape of the metallic core material 30 may define the internal void 20. FIGS. 3 and 4 depict two different shapes of the vapor chamber device. Unlike the application of the first metallic layer 16 to the heat generating component, an interface material and/or adhesive may be applied to an exposed surface of the first metallic layer 16 to adhere the metallic core material 30. Aluminum, zinc, a composite material, and/or another type of material may be included in the metallic core material 30. Alternatively, the metallic core material 30 may be applied to the first metallic layer 16 by way of vacuum deposition or masking and sputtering. Once the metallic core material 30 is in place on the first metallic layer 16, the second metallic layer 18 may be deposited onto the surface of the metallic core material 30 such that the second metallic layer 18 contacts the first metallic layer 16 at a perimeter. This contact between the first and second metallic layers 16, 18 is shown in FIGS. 3 and 4.

FIGS. 5A and 5B show the vapor chamber device according to two example embodiments. A port 32 is depicted. One or more ports 32 may be formed after the second metallic layer 18 has been deposited on the metallic core material 30, the port 32 created by drilling into the second metallic layer 18, masking and etching, or by way of another appropriate process by which an opening may be created for the port 32. The metallic core material 30 may be removed via the port 32 that is subsequently closed; however, after removing the metallic core material 30 and before closing the port 32, the internal void 20 of the vapor chamber 12 may be filled with a working fluid.

One potential advantage of using aluminum for the metallic core material 30 may be that either an acid or a base may be employed to etch away the metallic core material 30; a base may not interact with the first and second metallic layers 16, 18 when these layers are formed from copper. An additional potential advantage of using aluminum for the metallic core material 30 is that as aluminum is conductive, the second metallic layer 18 may be electroplated or electroformed on the surface of the metallic core material 30 without requiring the addition of any metallic layering on the metallic core material 30 for these respective processes. In another implementation, the metallic core material 30 may have a surface pattern from etching, rolling, embossing, etc., such that when the metallic core material 30 is removed, a pattern remains on the interior surface of the second metallic layer 18. Capillary action of a working fluid may thus be facilitated.

A solvent may be used to wash away any interface material and/or adhesive applied to hold the metallic core material 30 on the first metallic layer 16. The materials to be removed may exit out of the vapor chamber 12 via the port 32, as indicated by the arrow in FIGS. 5A and 5B. Once the internal void 20 of the vapor chamber device has been adequately cleaned, the port 32 may be sealed by soldering, laser welding, or another appropriate method. Prior to sealing, the internal void 20 of the vapor chamber 12 may be charged with working fluid such as water.

As also shown in FIGS. 5A and 5B, a mesh material 34 may be embedded in the metallic core material 30 at least in part. In FIG. 5A, the mesh material 34 contacts the first metallic layer 16 and follows the lower interior surfaces of the vapor chamber 12. In FIG. 5B, the mesh material 34 surrounds the interior of the vapor chamber 12 along the interior wall. The thickness of the mesh material 34 may be, in one implementation, about one-third the thickness of the thinnest part of the vapor chamber 12. One potential advantage of including a mesh material 34 in the vapor chamber 12 is that capillary action of a working fluid may be facilitated. As the working fluid condenses at regions distal to the heat generating component, the mesh material 34 may facilitate the return of the working fluid to proximate the heat generating component such that the evaporation and condensation cycle may repeat, thus continually drawing heat away from the heat-generating component.

The mesh material 34 may remain within the internal void 20 of the vapor chamber 12 after the metallic core material 30 is removed. One way to accomplish this configuration may be to form the metallic core material 30 by compression of one or more metal powders. Forming the metallic core material 30 in this manner may or may not include a mesh material 34. However, in a case where a mesh material 34 is included in an aggregation of one or more metal powders, the one or more metal powders subsequently compressed to form a mass, the mesh material 34 may be embedded partially or totally within the mass of aggregate metal powder that forms the metallic core material 30. When the metallic core material 30 is etched from the vapor chamber 12 and removed via port 32, the mesh material 34 may remain in the internal void 20 if impervious to the etchant.

In an alternative configuration, when more than one type of metal powder is used to form the metallic core material 30, only a subset of the metals formed from the one or more metal powders may be removed with an etchant by way of the port 32. That is, the metallic core material 30 may be formed from multiple metal powders having different levels of imperviousness to etchants. In one example, two metal powders are aggregated to from the metallic core material 30, but one is easily removed with an acid etchant while the other metal is resistant to the same acid etchant. Thus, one metal type may be removed while the other type remains within the vapor chamber 12. This configuration may also facilitate capillary action of a working fluid through a porous interior of the vapor chamber 12.

FIGS. 6A and 6B show the vapor chamber device according to an additional example implementation, where FIG. 6A is a top view and FIG. 6B is a cross-sectional view of FIG. 6A through the line indicated in FIG. 6A. To achieve the implementation shown in FIGS. 6A and 6B, one or more openings may be formed through the metallic core material 30 before adhering the metallic core material 30 to the first metallic layer 16. The second metallic layer 18 may be deposited on surfaces of the one or more openings to form one or more walls. The one or more walls may form one or more hollow columns 38 through the internal void 20 of the vapor chamber 12 after the metallic core material 30 is removed, as shown in FIGS. 6A and 6B. In one implementation, the hollow columns 38 may support the interior of the vapor chamber 12, and may also hold the mesh material 34. The hollow columns 38 may further include one or more extensions 40 of the one or more walls of the one or more hollow columns 38 on an exterior of the vapor chamber 12, adjacent the one or more hollow columns 38. The one or more extensions 40 may be formed by first constructing the hollow columns 38 as described above followed by masking and plating additional copper onto the vapor chamber 12. Although the extensions 40 are shown in FIG. 6B, the vapor chamber 12 may only include the hollow columns 38 without the extensions 40. The one or more extensions 40 may be fluted/trumpet shaped as shown in FIG. 6B, or may be formed as cylinders, asymmetrically, or with a geometry appropriate to the application. The hollow columns 38 may alternatively be formed by machining and/or etching. One potential advantage of this configuration is that the hollow columns may increase the surface area of the vapor chamber device for heat dissipation, and air may move through the hollow columns 38 thus increasing the efficiency with which heat is removed from the heat generating component by the vapor chamber device. To encourage the movement of air and dissipation of heat, fans 28 may be placed on one side of the hollow columns 38 to produce forced convection. It will be appreciated that the additional material forming the one or more extensions 40 may also function as a heat sink.

Figure 8:
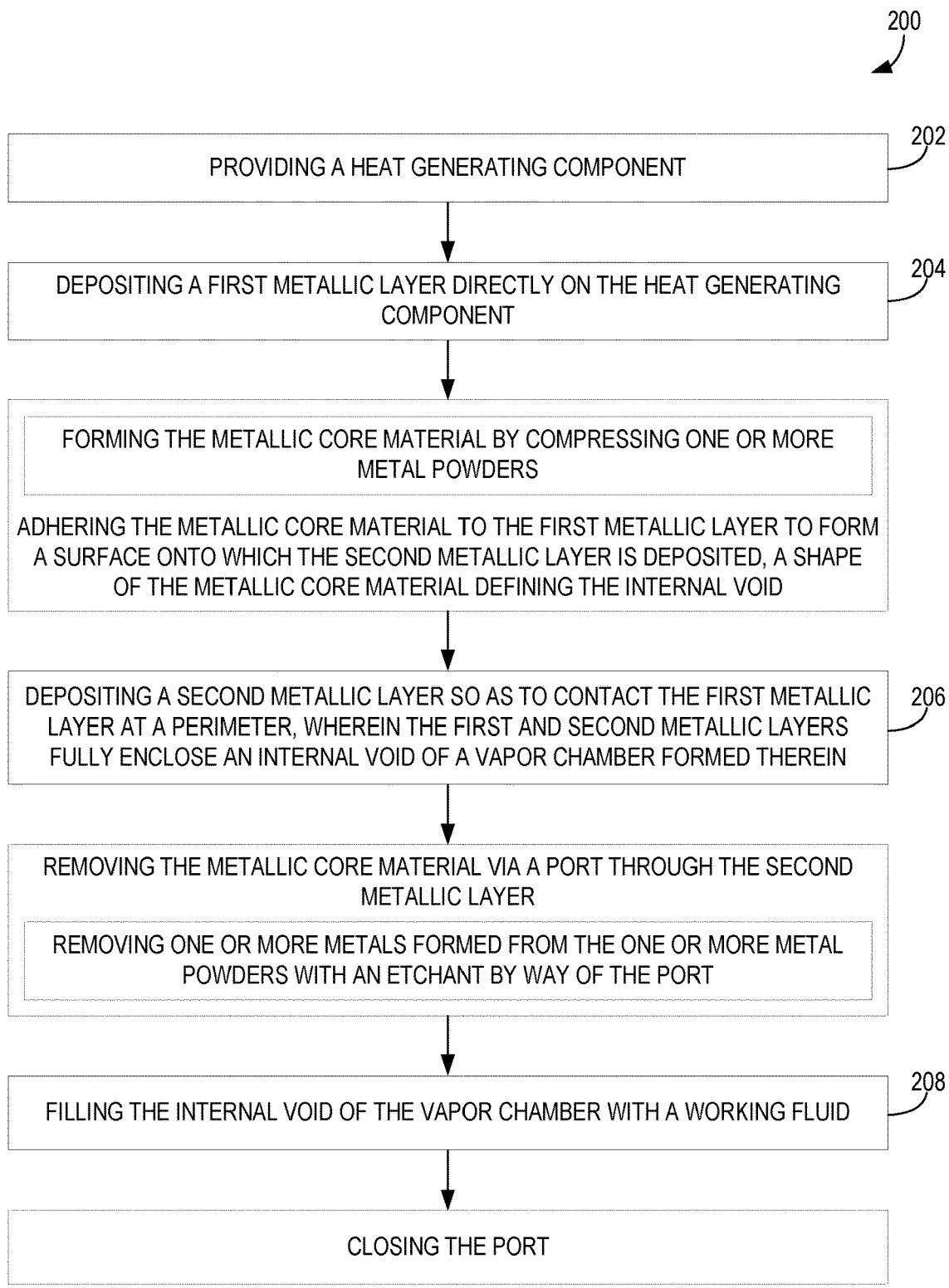
FIG. 8 is a flowchart of a method according to one implementation of the present disclosure.

FIG. 8 shows a flowchart of a method 200 for manufacturing a vapor chamber. The following description of method 200 is provided with reference to the vapor chambers described above and shown in the electronic device of FIG. 1. It will be appreciated that method 200 may also be performed in other contexts using other suitable components.

With reference to FIG. 8, the method 200 for manufacturing a vapor chamber at 202 may include providing a heat-generating component. The heat-generating component may be a processor 14, a GPU, integrated circuit, display, laser, or other heat-generating component. FIG. 7 shows progressive steps in the manufacture of the vapor chamber device. At 102 in FIG. 7, a heat-generating component in the form of a processor 14 is provided. In FIG. 8, at 204, the method 200 may include depositing a first metallic layer 16 directly on the heat-generating component. This corresponds to 104 in FIG. 7. The method 200 at 206 may include depositing a second metallic layer 18 so as to contact the first metallic layer 16 at a perimeter, where the first and second metallic layers 16, 18 fully enclose an internal void 20 of a vapor chamber 12 formed therein.

Before step 206, however, the method 200 may include forming the metallic core material 30 by compressing one or more metal powders as discussed above. Following formation of the metallic core material 30, the method 200 may include adhering the metallic core material 30 to the first metallic layer 16 to form a surface onto which the second metallic layer 18 may be deposited, which is shown at 106 in FIG. 7. A shape of the metallic core material 30 may define the internal void 20. Adhering the metallic core material 30 may include a bonding and/or adhering material to fix the metallic core material 30 to the first metallic layer 16. Method step 206 in FIG. 8, depositing a second metallic layer 18, is shown schematically in FIG. 7 at 108. In this step, the second metallic layer 18 may be deposited to cover entirely the metallic core material 30, the second metallic layer 18 contacting the first metallic layer 16 at a perimeter. In FIG. 7, the metallic core material 30 interior to the second metallic layer 18 is indicated with dotted lines.

Following step 206 in FIG. 8, the method 200 may include removing the metallic core material 30 via a port 32 through the second metallic layer 18. FIG. 7 at 110 depicts upper and lower ports 32 through second metallic layer 18. As shown, the metallic core material 30 may be etched away and the internal void 20 may be flushed out, fluid added through the upper port 32 and exiting through the lower port 32 as indicated by the direction of the arrows at 110 in FIG. 7. When the metallic core material 30 is formed from one or more metal powders, the method 200 may include removing the one or more metals formed from the one or more metal powders with an etchant by way of the port 32. In FIG. 8, the method 200 at 208 may include filling the internal void 20 of the vapor chamber 12 with a working fluid. After step 208, the method 200 may include closing the port 32. FIG. 7 at 112 shows the vapor chamber 12 once the internal void 20 has been charged with a working fluid and any ports 32 sealed. As described herein, therefore, vapor chamber construction may be relatively seamless compared to building the vapor chamber 12 separately and thermally connecting it to the heat generating component with, for example, a thermal interface material 36 and a spring force compressing the components in the finished electronic device 10.

As discussed above, the heat-generating component may be a silicon chip onto which electronic components have been formed by sputtering, and the first metallic layer 16 may be deposited by sputtering on a surface of the silicon chip opposite from a surface onto which the electronic components have been formed. The forming of the electronic components and the depositing of the first metallic layer 16 may be executed in a single manufacturing process. A potential advantage of executing these steps in a single manufacturing process is that building the silicon chip and vapor chamber 12 may be more efficient. The first and second metallic layers 16, 18 may be deposited by one or more processes selected from the group consisting of sputtering, electroplating, electroforming, and electroless plating. The first and second metallic layers 16, 18 may include one or more materials selected from the group consisting of copper and gold. It will be appreciated that material and method choices may be dependent on the application for which the vapor chamber device is being constructed.

As described above, a mesh material 34 may be embedded in the metallic core material 30 at least in part. By forming the mesh material 34 from a material that is impervious to an etchant, the mesh material 34 may remain within the internal void 20 of the vapor chamber 12 after the metallic core material 30 is removed. As also described above, a thermal interface material 36 may be applied to an external surface of the second metallic layer 18, and an additional thermal module 22 may interface with the thermal interface material 36. The additional thermal module 22 may include one or more components selected from the group consisting of a heat sink, a heat spreader, a heat pipe, and a second vapor chamber. Other configurations for the additional thermal module 22 may also be implemented as appropriate for a given electronic device 10.

As further described above, the first metallic layer 16, the internal void 20, and the second metallic layer 18 may have a combined thickness of at least 0.30 mm. A surface area of the first metallic layer 16 may be substantially equal to a surface area of the heat-generating component at a surface on which the first metallic layer 15 is deposited, as shown in FIGS. 3 and 4. As described above and shown in FIGS. 6A and 6B, one or more openings may be formed through the metallic core material 30, and the second metallic layer 18 may be deposited on surfaces of the one or more openings to form one or more walls. The one or more walls may form one or more hollow columns 38 through the internal void 20 of the vapor chamber 12 after the metallic core material 30 is removed. This configuration may be advantageous to moving heat away from the heat generating component, as airflow through the hollow columns 38 may assist in the dissipation of heat. As described above, one or more extensions 40 of the one or more walls of the one or more hollow columns 38 on an exterior of the vapor chamber 12 adjacent the one or more hollow columns 38 may be included in the vapor chamber device. This configuration may enhance contact between the vapor chamber 12 and the surrounding air.

Forming the vapor chamber 12 directly on a heat generating component as described herein may increase the performance of the vapor chamber device, removing a need for thermal interface material 36 at the junction of the heat generating component and vapor chamber 12. Additional implementations that include the hollow columns 38 and extensions 40 may further enhance the heat-dissipation capacity of the vapor chamber device. By combining manufacturing steps through sputtering both electrical components and the first metallic layer 16 on a silicon chip, the manufacturing process may also be streamlined when building processors for electronic devices 10.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

The following paragraphs provide additional support for the claims of the subject application. One aspect provides a vapor chamber device comprising a heat-generating component, a first metallic layer deposited directly on the heat-generating component, and a second metallic layer deposited so as to contact the first metallic layer at a perimeter. The first and second metallic layers fully enclose an internal void of a vapor chamber formed therein.

In this aspect, additionally or alternatively, the heat-generating component may be a silicon chip onto which electronic components have been formed by sputtering. In this aspect, additionally or alternatively, the first metallic layer may be deposited by sputtering on a surface of the silicon chip opposite from a surface onto which the electronic components have been formed; the forming of the electronic components and the depositing of the first metallic layer may be executed in a single manufacturing process. In this aspect, additionally or alternatively, the first and second metallic layers may be deposited by one or more processes selected from the group consisting of sputtering, electroplating, electroforming, and electroless plating.

In this aspect, additionally or alternatively, the first metallic layer and the second metallic layer may include one or more materials selected from the group consisting of copper and gold. In this aspect, additionally or alternatively, a metallic core material that may be adhered to the first metallic layer may form a surface onto which the second metallic layer may be deposited. A shape of the metallic core material may define the internal void. The metallic core material may be removed via a port that may be subsequently closed after filling the internal void of the vapor chamber with a working fluid.

In this aspect, additionally or alternatively, the metallic core material may be formed by compression of one or more metal powders. In this aspect, additionally or alternatively, a mesh material may be embedded in the metallic core material at least in part. The mesh material may remain within the internal void of the vapor chamber after the metallic core material is removed. In this aspect, additionally or alternatively, a thermal interface material may be applied to an external surface of the second metallic layer, and an additional thermal module may be included that interfaces with the thermal interface material. In this aspect, additionally or alternatively, the vapor chamber may be a first vapor chamber, and the additional thermal module may include one or more components selected from the group consisting of a heat sink, a heat spreader, a heat pipe, and a second vapor chamber.

In this aspect, additionally or alternatively, the first metallic layer, the internal void, and the second metallic layer may have a combined thickness of at least 0.30 mm and a surface area of the first metallic layer may be substantially equal to a surface area of the heat-generating component at a surface on which the first metallic layer is deposited. In this aspect, additionally or alternatively, one or more openings may be formed through the metallic core material. The second metallic layer may be deposited on surfaces of the one or more openings to form one or more walls. The one or more walls may form one or more hollow columns through the internal void of the vapor chamber after the metallic core material is removed. In this aspect, additionally or alternatively, one or more extensions of the one or more walls of the one or more hollow columns may be included on an exterior of the vapor chamber, adjacent the one or more hollow columns.

Another aspect provides a method for manufacturing a vapor chamber device, the method comprising providing a heat generating component; depositing a first metallic layer directly on the heat-generating component; depositing a second metallic layer so as to contact the first metallic layer at a perimeter, wherein the first and second metallic layers fully enclose an internal void of a vapor chamber formed therein; and filling the internal void of the vapor chamber with a working fluid.

In this aspect, additionally or alternatively, the heat-generating component may be a silicon chip onto which electronic components have been formed by sputtering, and the first metallic layer may be deposited by sputtering on a surface of the silicon chip opposite from a surface onto which the electronic components have been formed. The forming of the electronic components and the depositing of the first metallic layer may be executed in a single manufacturing process. In this aspect, additionally or alternatively, the first and second metallic layers may be deposited by one or more processes selected from the group consisting of sputtering, electroplating, electroforming, and electroless plating, and the first and second metallic layers may include one or more materials selected from the group consisting of copper and gold.

In this aspect, additionally or alternatively, the method may include adhering a metallic core material to the first metallic layer to form a surface onto which the second metallic layer may be deposited. A shape of the metallic core material may define the internal void. The method may include removing the metallic core material via a port through the second metallic layer and closing the port. In this aspect, additionally or alternatively, the method may include forming the metallic core material by compressing one or more metal powders and removing one or more metals formed from the one or more metal powders with an etchant by way of the port. In this aspect, additionally or alternatively, the method may include forming one or more openings through the metallic core material and depositing the second metallic layer on surfaces of the one or more openings to form one or more walls, the one or more walls forming one or more hollow columns through the internal void of the vapor chamber after the metallic core material is removed.

Another aspect provides a vapor chamber device comprising a heat-generating component; a first metallic layer deposited directly on the heat-generating component; and a second metallic layer deposited so as to contact the first metallic layer at a perimeter, wherein the first and second metallic layers fully enclose an internal void of a vapor chamber formed therein. A metallic core material is adhered to the first metallic layer to form a surface onto which the second metallic layer is deposited. A shape of the metallic core material defines the internal void. The metallic core material is formed by compression of one or more metal powders. One or more metals formed from the one or more metal powders is removed with an etchant by way of a port that is subsequently closed.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed. If used herein, a phrase of the form "at least one of A and B" means at least one A or at least one B, without being mutually exclusive of each other, and does not require at least one A and at least one B. If used herein, the phrase "and/or" means any or all of multiple stated possibilities.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A vapor chamber device, comprising:
a heat-generating component;
a first non-solder metallic layer deposited directly on a surface of the heat-generating component such that the first non-solder metallic layer is formed in place on and directly contacts the surface of the heat-generating component;
a metallic core material adhered to the first non-solder metallic layer;
a second metallic layer deposited so as to contact the first non-solder metallic layer at a perimeter and deposited on a surface of the metallic core material, wherein the first non-solder metallic layer and the second metallic layer fully enclose an internal void of a vapor chamber formed therein; and
one or more openings formed through the metallic core material, the one or more openings being open to an outside of the first non-solder metallic layer and the second metallic layer and not fluidly communicating with the internal void, the one or more openings configured to allow air to pass therethrough for heat dissipation,
wherein the metallic core material is removed via a port that is subsequently closed after filling the internal void of the vapor chamber with a working fluid, and
wherein the second metallic layer is further deposited on surfaces of the one or more openings to form one or more walls, the one or more walls forming one or more hollow columns through the internal void of the vapor chamber after the metallic core material is removed.

2. The vapor chamber device of claim 1, wherein the heat-generating component is a silicon chip onto which electronic components have been formed by sputtering.

3. The vapor chamber device of claim 2, wherein the first non-solder metallic layer is deposited by sputtering on the surface of the silicon chip opposite from a surface onto which the electronic components have been formed, the forming of the electronic components and the depositing of the first non-solder metallic layer executed in a single manufacturing process.

4. The vapor chamber device of claim 1, wherein the first non-solder metallic layer and the second metallic layer are deposited by one or more processes selected from the group consisting of sputtering, electroplating, electroforming, and electroless plating.

5. The vapor chamber device of claim 1, wherein the first non-solder metallic layer and the second metallic layer include one or more materials selected from the group consisting of copper and gold.

6. The vapor chamber device of claim 1, wherein a shape of the metallic core material defines the internal void.

7. The vapor chamber device of claim 6, wherein the metallic core material is formed by compression of one or more metal powders.

8. The vapor chamber device of claim 1, further comprising a thermal interface material applied to an external surface of the second metallic layer, and an additional thermal module interfacing with the thermal interface material.

9. The vapor chamber device of claim 8, wherein the vapor chamber is a first vapor chamber, and wherein the additional thermal module includes one or more components selected from the group consisting of a heat sink, a heat spreader, a heat pipe, and a second vapor chamber.

10. The vapor chamber device of claim 1, wherein the first non-solder metallic layer, the internal void, and the second metallic layer have a combined thickness of at least 0.30 mm and a surface area of the first non-solder metallic layer is substantially equal to a surface area of the heat-generating component at the surface on which the first non-solder metallic layer is deposited.

11. The vapor chamber device of claim 1, further comprising one or more extensions of the one or more walls of the one or more hollow columns on an exterior of the vapor chamber, adjacent the one or more hollow columns.

12. The vapor chamber device of claim 11, wherein the one or more extensions are fluted and/or trumpet-shaped.

13. A vapor chamber device, comprising:
a heat-generating component;
a first non-solder metallic layer deposited directly on a surface of the heat-generating component such that the first non-solder metallic layer is formed in place on and directly contacts the surface of the heat-generating component;
a metallic core material adhered to the first non-solder metallic layer;
a second metallic layer deposited so as to contact the first non-solder metallic layer at a perimeter and deposited on a surface of the metallic core material, wherein the first non-solder metallic layer and the second metallic layer fully enclose an internal void of a vapor chamber formed therein; and
one or more openings formed through the metallic core material, the one or more openings being open to an outside of the first non-solder metallic layer and the second metallic layer and not fluidly communicating with the internal void, the one or more openings configured to allow air to pass therethrough for heat dissipation, wherein the metallic core material adhered to the first non-solder metallic layer forms a surface onto which the second metallic layer is deposited, a shape of the metallic core material defining the internal void, the metallic core material is formed by compression of one or more metal powders, one or more metals formed from the one or more metal powders is removed with an etchant by way of a port that is subsequently closed, and the second metallic layer is further deposited on surfaces of the one or more openings to form one or more walls, the one or more walls forming one or more hollow columns through the internal void of the vapor chamber after the metallic core material is removed.

\* \* \* \* \*